US011901326B2

(12) United States Patent
Asada et al.

(10) Patent No.: US 11,901,326 B2
(45) Date of Patent: Feb. 13, 2024

(54) SEMICONDUCTOR DEVICE WITH BRANCH ELECTRODE TERMINAL AND METHOD OF MANUFACTURING SEMICONDUCTOR DEVICE

(71) Applicant: Mitsubishi Electric Corporation, Tokyo (JP)

(72) Inventors: Shinsuke Asada, Tokyo (JP); Satoru Ishikawa, Tokyo (JP); Yuki Yano, Tokyo (JP); Shohei Ogawa, Tokyo (JP); Kiyoshi Arai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 119 days.

(21) Appl. No.: 17/546,695

(22) Filed: Dec. 9, 2021

(65) Prior Publication Data

US 2022/0254749 A1 Aug. 11, 2022

(30) Foreign Application Priority Data

Feb. 9, 2021 (JP) .................................. 2021-018759

(51) Int. Cl.
*H01L 23/00* (2006.01)
(52) U.S. Cl.
CPC .............. *H01L 24/37* (2013.01); *H01L 24/35* (2013.01); *H01L 24/48* (2013.01); *H01L 2224/35125* (2013.01); *H01L 2224/3701* (2013.01); *H01L 2224/48153* (2013.01)

(58) Field of Classification Search
CPC ....................................................... H01L 24/37
USPC ........................................................... 257/46
See application file for complete search history.

(56) References Cited

U.S. PATENT DOCUMENTS

2015/0061098 A1* 3/2015 Imoto ..................... H01L 21/50
257/676
2018/0076149 A1* 3/2018 Asai ....................... H01L 23/367

FOREIGN PATENT DOCUMENTS

JP          2015-046416 A       3/2015

* cited by examiner

*Primary Examiner* — Ajay Arora
(74) *Attorney, Agent, or Firm* — Studebaker & Brackett PC

(57) ABSTRACT

An object is to provide a semiconductor device which suppresses poor bonding between a metal pattern and an electrode terminal due to insufficient temperature rise at the time of bonding the metal pattern and the electrode terminal. The electrode terminal is branched into a plurality of branch portions in a width direction on one end side of an extending direction thereof, of the plurality of branch portions, a first branch portion and a second branch portion are bonded on the metal pattern via a bonding material, respectively, the first branch portion has a wider width than that of the second branch portion, and the bonding material between the second branch portion and the metal pattern is thinner than the bonding material between the first branch portion and the metal pattern.

22 Claims, 9 Drawing Sheets

SEMICONDUCTOR DEVICE WITH BRANCH ELECTRODE TERMINAL AND METHOD OF MANUFACTURING SEMICONDUCTOR DEVICE

BACKGROUND OF THE INVENTION

Field of the Invention

The present disclosure relates to a semiconductor device.

Description of the Background Art

In Japanese Patent Application Laid-Open No. 2015-046416, a semiconductor device is disclosed, including a conductive portion including semiconductor elements provided on a substrate, a case accommodating the conductive portion, and a lead terminal integrally formed with the case and connected directly to the semiconductor elements or the wiring of the substrate.

SUMMARY

In bonding a metal pattern on an insulating substrate and an electrode terminal together, the sufficiently raised temperature at the bonding points of both the metal pattern and the electrode terminal is required at the time of bonding. There has been a problem that, during bonding, a gap formed between the metal pattern and the electrode terminal can cause insufficient heat conduction between the metal pattern and the electrode terminal and insufficient temperature rise of either one of them, resulting in unfavorable bonding.

An object of the present disclosure is to provide a semiconductor device which suppresses poor bonding between a metal pattern and an electrode terminal due to insufficient temperature rise at the time of bonding the metal pattern and the electrode terminal.

The semiconductor module according to the first aspect of the present disclosure includes a metal pattern, a semiconductor element bonded on the metal pattern, and an electrode terminal extending with a width. The electrode terminal is branched into a plurality of branch portions in a width direction on one end side of an extending direction thereof. A first branch portion and a second branch portion of the plurality of branches are bonded on the metal pattern via a bonding material, respectively. The first branch portion has a wider width than that of the second branch portion. The bonding material between the second branch portion and the metal pattern is thinner than the bonding material between the first branch portion and the metal pattern.

With the above configuration, a semiconductor device is provided which suppresses poor bonding between a metal pattern and an electrode terminal due to insufficient temperature rise at the time of bonding the metal pattern and the electrode terminal.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

<A-1. Configuration>

Figure 1:
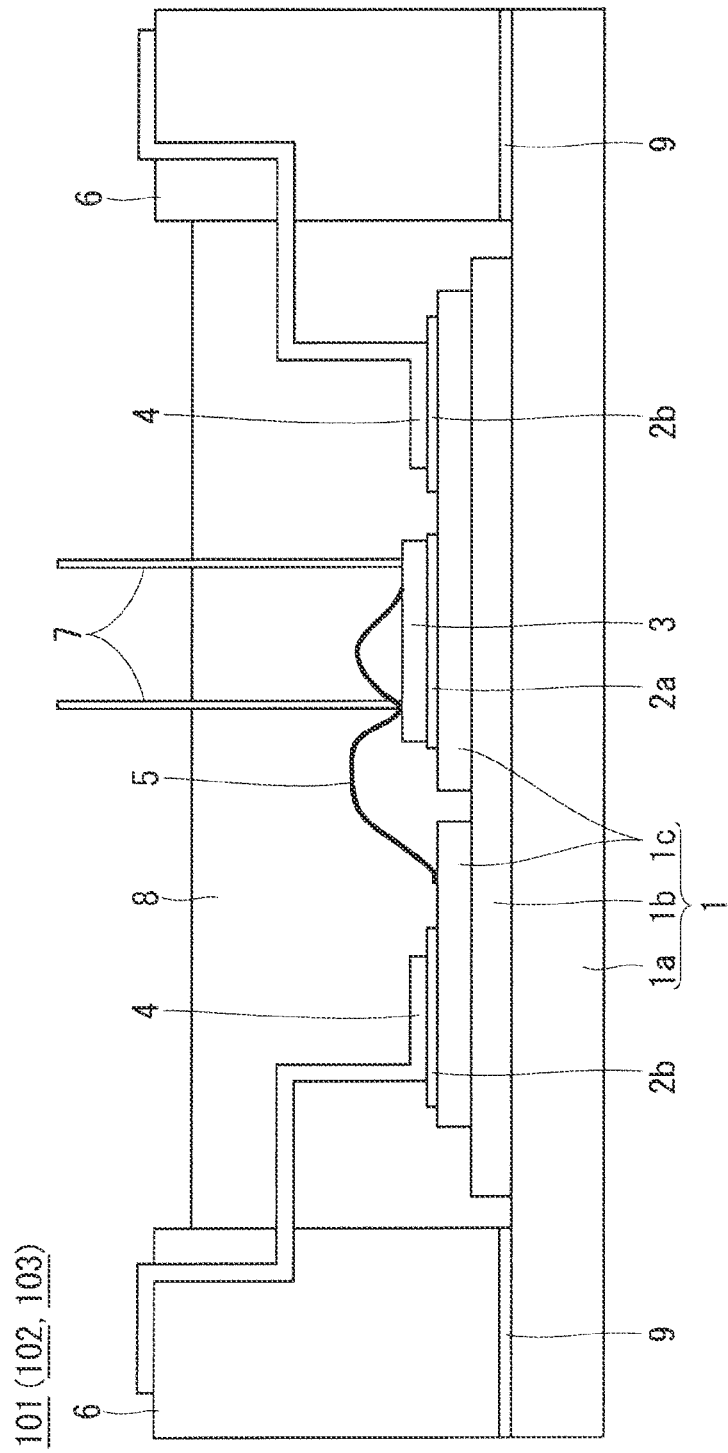
FIG. 1 is a cross-sectional view of a semiconductor device of Embodiments 1 to 3.

FIG. 1 is a cross-sectional view illustrating a semiconductor device 101 of Embodiment 1. As illustrated in FIG. 1, the semiconductor device 101 includes a base portion 1, a bonding material 2a, bonding materials 2b, a semiconductor element 3, a main electrode terminal 4, metal wires 5, a case 6, signal terminals 7, a sealing resin 8, and an adhesive 9.

The bonding material 2a is a bonding material that bonds the semiconductor element 3 and a metal pattern 1c.

The bonding materials 2b is bonding materials that bonds metal patterns 1c and the main electrode terminal 4.

The metal wires 5 are wires for wiring inside the semiconductor device 101.

Although the signal terminals 7 are drawn as if they are in contact with the upper surface of the semiconductor element 3 in FIG. 1, the signal terminals 7 are actually bonded, via the bonding material 2b, onto the metal pattern 1c which are in deeper inside portions in the drawing with respect to the sheet surface from the semiconductor element 3.

The adhesive 9 is an adhesive that adheres the case 6 and the base portion 1.

The base portion 1 includes a heat sink 1a, an insulating substrate 1b, and metal patterns 1c. The heat sink 1a is provided on one main surface of the insulating substrate 1b, and the metal pattern 1c is provided on the other main surface of the insulating substrate 1b. The metal patterns 1c have conductivity. The material of the metal patterns 1c is, for example, copper or aluminum. The material of the insulating substrate 1b is, for example, a ceramic having high thermal conductivity, such as aluminum nitride (AlN) or silicon nitride (SiN). The material of the insulating substrate 1b may also be an insulating resin. The insulating substrate 1b desirably has high thermal conductivity.

The semiconductor element 3 is, for example, a semiconductor element using a silicon semiconductor. The semiconductor element 3 may be a semiconductor element using a wide bandgap semiconductor having a larger bandgap than silicon. The wide bandgap semiconductor is, for example, a semiconductor using a SiC or GaN-based material.

The semiconductor element 3 is, for example, a diode, a Metal-Oxide-Semiconductor Field-Effect Transistor (MOS-FET), an Insulated-Gate Bipolar Transistor (IGBT), or a Reverse-Conducting Insulated Gate Bipolar Transistor (RC-IGBT).

The semiconductor element 3 is bonded onto the metal circuit pattern 1c of the base portion 1 by the bonding material 2a. Although FIG. 1 illustrates a case where one semiconductor element is bonded on the base portion 1, the number of semiconductor elements bonded onto the base portion 1 is not limited to one, a required number of semiconductor elements may be bonded onto the base portion 1 according to the application.

The bonding material 2a that bonds the semiconductor element 3 and the base portion 1 is, for example, solder. For the solder, there is tin (Sn)-based solder, for example, but the material is not particularly limited thereto. Further, plate solder may be used as the bonding material 2a, or paste solder may also be used therefor. In the description of the manufacturing method described later, a case where the semiconductor element 3 and the base portion 1 are bonded using plate solder will be described.

In an internal circuit of the semiconductor device 101, the semiconductor element 3 and the metal pattern 1c, the main electrode terminal 4 and the metal pattern 1c, and the signal terminals 7 and the metal pattern 1c are formed in a manner that the metal wires 5, the bonding material 2a and the bonding material 2b electrically connecting therebetween, respectively.

Figure 4:
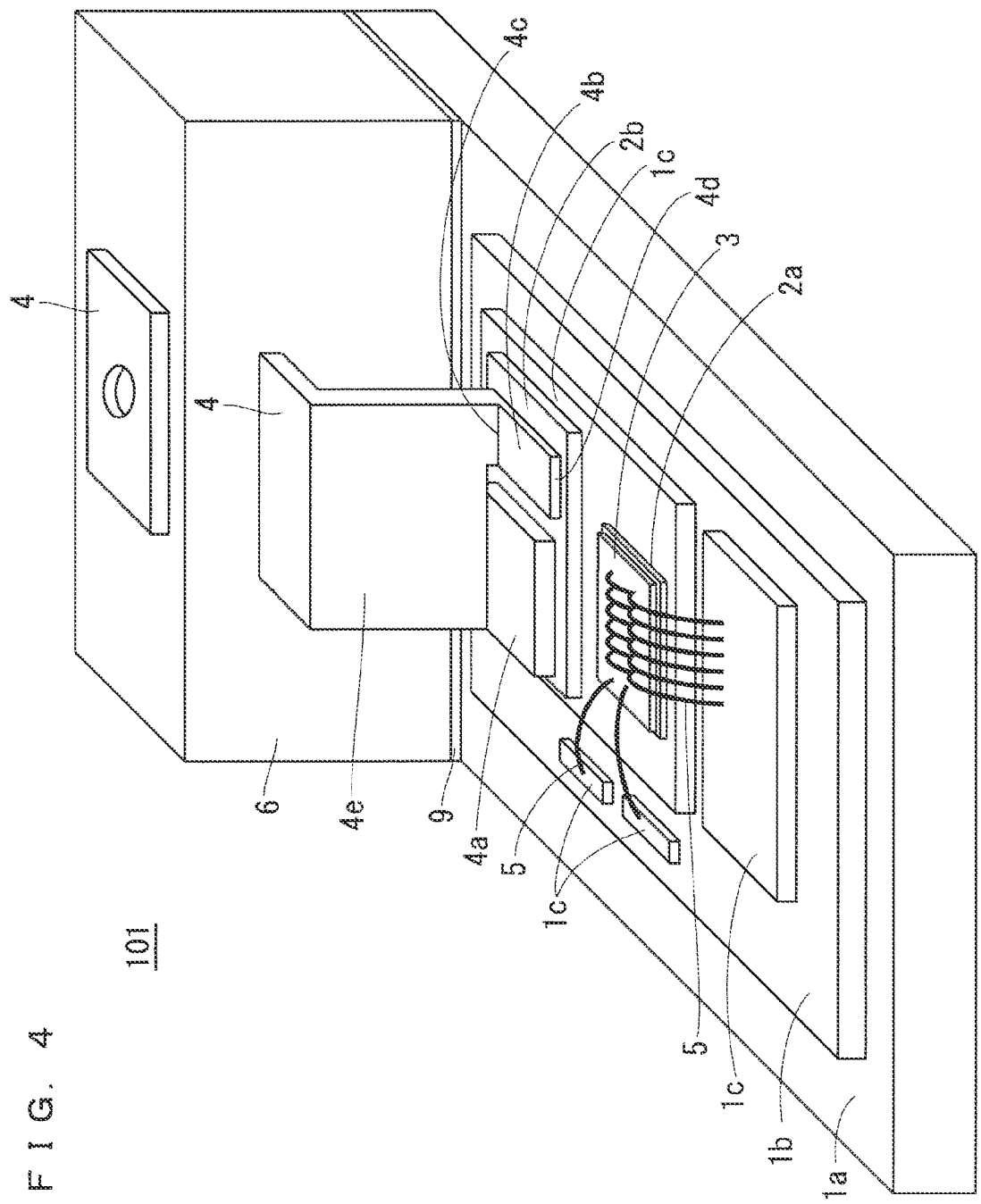
FIG. 4 is a diagram illustrating a bonded state between a main electrode terminal and a metal pattern of the semiconductor device of Embodiment 1.

The main electrode terminal 4 is an electrode terminal for inputting a current controlled by the semiconductor element 3 to the semiconductor element 3 from the outside of the semiconductor device 101. FIG. 4 is a diagram illustrating a bonded portion between the main electrode terminal 4 and the metal pattern 1c.

The signal terminals 7 are terminals for inputting a signal which control the semiconductor element 3 to the semiconductor element 3 from the outside of the semiconductor device 101.

The material of the case 6 is, for example, a resin. The material of the case 6 preferably has a high softening point, which is a temperature at which the material begins to soften and deform; to prevent a problem caused when the temperature rises during the operation of the semiconductor device 101. The material of the case 6 is, for example, Poly Phenylene Sulfide (PPS). However, the material of the case 6 is not limited to PPS, and any material that does not undergo thermal deformation at the operating temperature of the semiconductor device 101 and has insulating properties may be applicable.

The sealing resin 8 is, for example, a Silicone-based gel or an epoxy-based resin.

A-2. Manufacturing Method

<A-2-1. Summary of Manufacturing Method>

Figure 9:
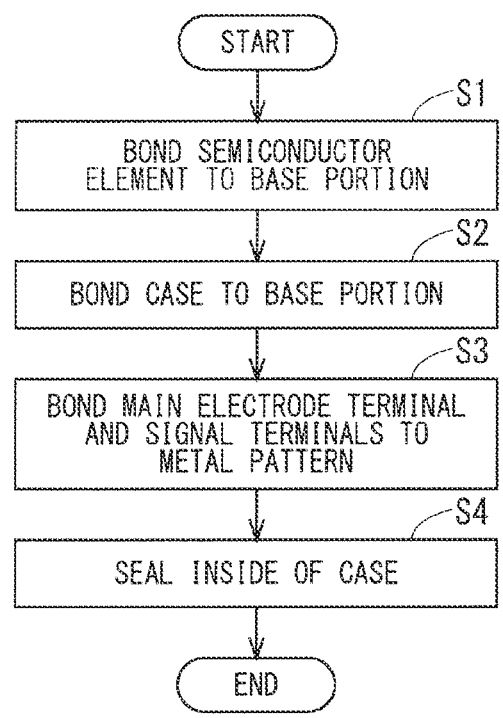
FIG. 9 is a flowchart of a manufacturing method of the semiconductor device of Embodiment 1 to 3.

FIG. 9 is a flowchart of a manufacturing method of the semiconductor device 101.

In Step S1, first, the semiconductor element 3 is bonded to the base portion 1 using the bonding material 2a. The bonding material 2a is, for example, plate solder. The plate solder is installed on the metal pattern 1c. When paste solder is used as the bonding material 2a, the paste solder is printed on the metal pattern 1c. In Step S1, the plate solder as the bonding material 2a is heated to a temperature exceeding the melting point to melt, and then cured to bond the base portion 1 and the semiconductor element 3.

Next, in Step S2, the case 6 to which the main electrode terminal 4 and the signal terminals 7 are fixed is bonded to the base portion 1. In Step S2, in preparation for bonding the case 6 to the base portion 1, the bonding material 2b is installed at the position where the main electrode terminal 4 is bonded and the position where the signal terminals 7 are bonded on the metal pattern 1c. The bonding material 2b is selected in consideration of the operating temperature of the semiconductor device. The bonding material 2b is, for example, plate solder. Further, in preparation for bonding the case 6 to the base portion 1, a silicone-based or epoxy-based adhesive 9 is applied to the lower surface of the case 6 being the bonding surface with the heat radiating plate 1a. With the bonding material 2b installed on the metal pattern 1c and the adhesive 9 applied to the lower surface of the case 6, the case 6 to which the main electrode terminal 4 and the signal terminals 7 are fixed is pressed onto the base portion 1 with application of load. The case 6 and the heat sink 1a are fastened with screws or the like, and the state of being pressed against each other is also maintained in the later Step S3.

In Step S3, the main electrode terminal 4 and the signal terminals 7 are bonded by the bonding material 2b on the metal pattern 1c of the base portion 1, respectively. The details of boding of the main electrode terminal 4 and the metal pattern 1c in Step S3 will be described later.

In Step S4, the inside of the case 6 is sealed with the sealing resin 8. Although the sealing resin 8 is, for example, a silicone gel or an epoxy resin, the sealing resin 8 is not limited thereto, and may be a resin having a desired elastic modulus and heat resistance.

<A-2-2. Specifics of Step S3 in Manufacturing Method>

The details of boding of the main electrode terminal 4 and the metal pattern 1c in Step S3 will be described.

First, the main electrode terminal 4 will be described.

Figure 2:
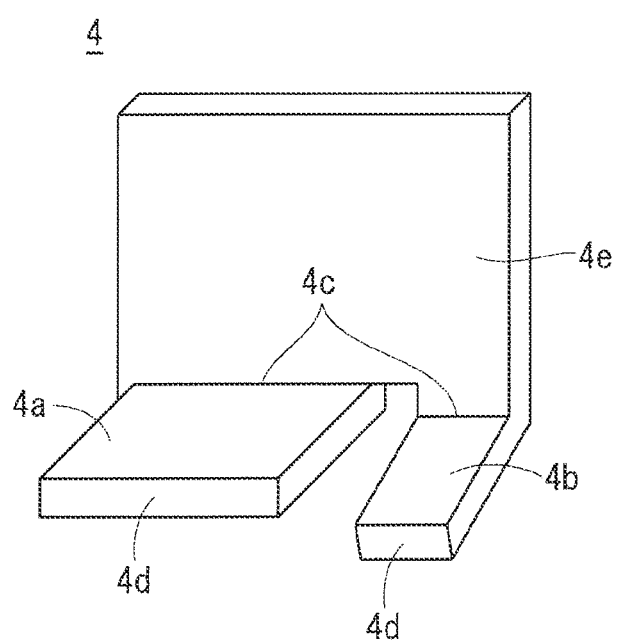
FIG. 2 is a perspective view of a part of a main electrode terminal of Embodiment 1.

FIG. 2 illustrates the state of the main electrode terminal 4 in Embodiment 1 before bonding to the metal pattern 1c. The main electrode terminal 4 has a thickness of about 0.5 mm to 1.2 mm. Further, the main electrode terminal 4 has a width and extends in the direction toward which a current flows. The main electrode terminal 4 is made of Cu or a material containing Cu.

In FIGS. 3A to 3D, an example of the state of the main electrode terminal 4 in Embodiment 1 after the bonding to the metal pattern 1c is represented by third angle projection. Further, in FIGS. 3A to 3D, the state of the main electrode terminal 4 before bonding to the metal pattern 1c is illustrated by the alternate long and short dash line.

In FIGS. 2 and 3A to 3D, only the vicinity of the portion of the main electrode terminal 4 to be bonding to the metal pattern 1c is illustrated.

As illustrated in FIGS. 2 and 3A to 3D, the bonding portion of the main electrode terminal 4 being the bonding portion with the metal pattern 1c being one end side portion in the extending direction thereof, is branched, in the width direction, into a wide branch portion 4a and a narrow branch portion 4b. The wide branch portion 4a and the narrow branch portion 4b each have a bend 4c. However, the wide branch portion 4a or the narrow branch portion 4b having a bend implies not only when there is a bend in the middle of the wide branch portion 4a or the narrow branch portion 4b, but also when there is a bend between the wide branch portion 4a or the narrow branch portion 4b and a trunk portion 4e. The length between the bend 4c and a tip portion 4d in the narrow branch portion 4b is longer than, for example, the length between the bend 4c and a tip portion 4d in the wide branch portion 4a. Each of the wide branch portion 4a and the narrow branch portion 4b is bonded on the metal pattern 1c via the bonding material 2b at the portion between the bend 4c and the tip portion 4d, that is, in the tip portion 4d side from the bend 4c.

Figure 3:
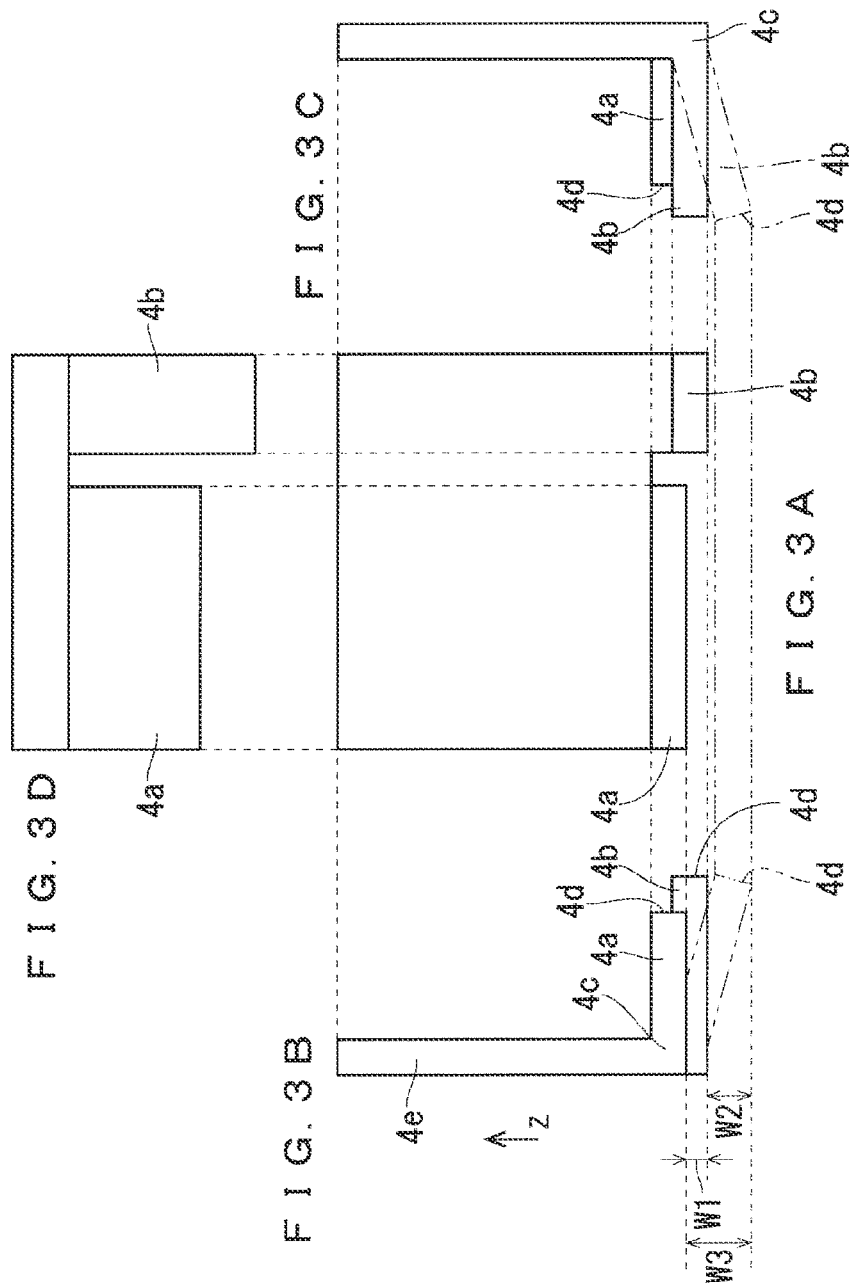
FIGS. 3A to 3D are diagrams illustrating a part of the main electrode terminal of Embodiment 1 represented by third angle projection.

In FIG. 3B, the plus z direction represents the direction perpendicular to the metal pattern 1c in the state of the main electrode terminal 4 after the main electrode terminal 4 and the metal pattern 1c are bonded each other. In FIG. 3B, for the state of the main electrode terminal 4 before the main electrode terminal 4 and the metal pattern 1c are bonded each other, the plus z direction represents the direction perpendicular to the metal pattern 1c in the arrangement when the main electrode terminal 4 and the metal pattern 1c are pressed against each other for bonding the main electrode terminal 4 and the metal pattern 1c each other. The metal pattern 1c is bonded to the main electrode terminal 4 on the minus z direction side. The plus z direction side is also referred to as the upper side, and the minus z direction side is also referred to as the lower side. The difference in position in the plus z direction is also referred to as a difference of elevation. As illustrated by the alternate long and short dash line in FIG. 3B or FIG. 3C, a difference of elevation W2 is provided between the bend 4c of the narrow branch portion 4b and the tip portion 4d of the narrow branch portion 4b in the state before bonding to the metal pattern 1c, so that the tip portion 4b of the narrow branch portion 4b is located at the lower side than the bend 4c of the narrow branch portion 4b. That is, when the main electrode terminal 4 and the metal pattern 1c are bonded each other, the narrow branch portion 4b is brought toward the metal pattern 1c in such an arrangement that the tip portion 4d of the narrow branch portion 4b is closer to the metal pattern 1c than the bent portion 4c of the narrow branch portion 4b is by the difference of elevation W2.

Before the main electrode terminal 4 and the metal pattern 1c are bonded each other, the difference of elevation between the bend 4c of the wide branch portion 4a and the tip portion 4d of the wide branch portion 4a is, for example, ¹⁄₁₀ or less of the difference of elevation W2. FIGS. 3A to 3D illustrate a case where there is no difference of elevation between the bend 4c of the wide branch portion 4a and the tip portion 4d of the wide branch portion 4a before the main electrode terminal 4 and the metal pattern 1c are bonded. Before bonded to the metal pattern 1c, the bend 4c of the wide branch portion 4a has a larger degree of bending than that of the bend 4c of the narrow branch portion 4b.

The difference of elevation W2 is, for example, set in such a manner that the difference of elevation W2 is almost eliminated and the narrow branch portion 4b become substantially parallel to the metal pattern 1c when the main electrode terminal 4 is bonded to the metal pattern 1c in Step S3 and the narrow branch portion 4b is pressed against the metal pattern 1c. The difference of elevation W2 is, for example, in the range of 50 μm or more and 150 μm or less and, for example, about 100 μm. The difference of elevation between the tip portion 4d of the narrow branch portion 4b and the bend 4c of the narrow branch portion 4b after the main electrode terminal 4 and the metal pattern 1c are bended each other is, for example, ¹⁄₁₀ or less of the difference of elevation W2 between the tip portion 4d of the narrow branch portion 4b and the bend 4c of the narrow branch portion 4b before the main electrode terminal 4 and the metal pattern 1c are bonded each other.

In order for the bend 4c of the narrow branch portion 4b to be located at the lower side than the bend 4c of the wide branch portion 4a, a difference of elevation W1 is provided between the bend 4c of the narrow branch portion 4b and the bend 4c of the wide branch portion 4a. The difference of elevation W1 is, for example, in the range of 50 μm or more and 150 μm or less and, for example, about 100 μm.

Before the main electrode terminal 4 and the metal pattern 1c are bonded each other, the tip portion 4d of the narrow branch portion 4b is located at the lower side than the wide branch portion 4a by a difference of elevation W3 being a difference combined with the difference of elevation W1 and the difference of elevation W2. The difference of elevation W3 is, for example, in the range of 100 μm or more and 300 μm or less, for example.

In the finished semiconductor device 101, the bonding material 2b between the narrow branch portion 4b and the metal pattern 1c is thinner than the bonding material 2b between the wide branch portion 4a and the metal pattern 1c. For example, the bonding material 2b between the narrow branch portion 4b and the metal pattern 1c is thinner in its entire region than the thinnest portion of the bonding material 2b between the wide branch portion 4a and the metal pattern 1c.

Figure 5:
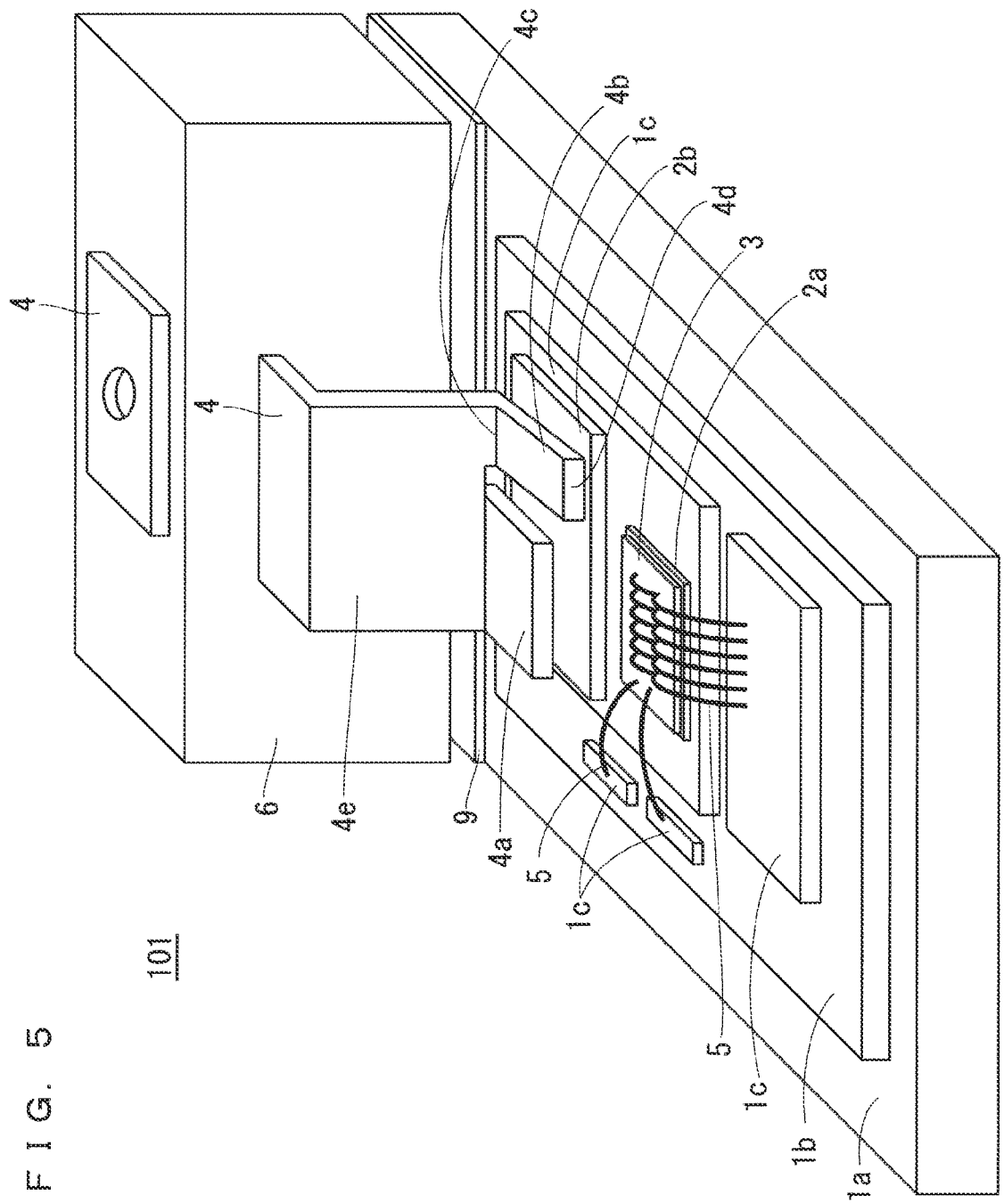
FIG. 5 is a diagram illustrating a state in a process of bonding the main electrode terminal and the metal pattern of the semiconductor device of Embodiment 1.

In Step S2, when the case 6 with the main electrode terminal 4 integrated is brought close to the base portion 1 to attach the case 6 to the base portion 1, as illustrated in FIG. 5, first, the tip portion 4d of the narrow branch portion 4b contacts the bonding material 2b mounted on the metal pattern 1c. In the state illustrated in FIG. 5, the narrow branch portion 4b is not in contact with the bonding material 2b in the bend 4c side. Further, the wide branch portion 4a is not in contact with the bonding material 2b.

When a load is further applied to the case 6 from the state illustrated in FIG. 5 and the case 6 is pushed down to the specified position, as illustrated in FIG. 4, the portion closer to the tip portion 4d side (that is, the part bonded to the metal pattern 1c) than the bend 4c of the narrow branch portion 4b is, is pressed against the metal pattern 1c; therefore, the degree of bending of the bend 4c of the narrow branch portion 4b becomes large. That is, the narrow branch portion 4b is deformed so that the tip portion 4d moves upward relative to the bend 4c, and the bonding portion of the narrow branch portion 4b with the metal pattern 1c is substantially parallel to the surface of the metal pattern 1c. Further, the narrow branch portion 4b is pressed against the metal pattern 1c via the bonding material 2b in a state where the bonding portion with the metal pattern 1c is substantially parallel to the surface of the metal pattern 1c.

The bonding between the main electrode terminal 4 and the metal pattern 1c by the bonding material 2b is performed by heating and melting the bonding material 2b, and then lowering the temperature of the bonding material 2b to cure the bonding material 2b. In the reflow system, the bonding material 2b is heated by blowing hot air onto the semiconductor device 101 at that stage or by bringing a heating plate into contact with the semiconductor device 101. If there is a large distance between the main electrode terminal 4 and the metal pattern 1c when the bonding material 2b is heated, the degree of temperature e of the main electrode terminal 4 and the metal pattern 1c are prone to be different, due to the influence of the heat capacity of each component of the semiconductor device 101 and the positional relationship with the heat source. In particular, when a heating plate is used to heat the bonding material 2b, the heating is typically performed from one side alone with respect to the semiconductor device 101; therefore, the large distance between the main electrode terminal 4 and the metal pattern 1c makes the difference in the degree of temperature rise between the main electrode terminal 4 and the metal pattern 1c all the more prominent. If the temperature rise of the main electrode terminal 4 or the metal pattern 1c is not sufficient, the quality of bonding the main electrode terminal 4 and the metal pattern 1c via the bonding material 2b deteriorates.

When the distance between the main electrode terminal 4 and the metal pattern 1c is large at the time of bonding due to the effects of accuracy of incorporating the main electrode terminal 4 into the case 6, assembly accuracy of case 6 and base 1, and deformation by heating during bonding, and the like, the heat transfer between the main electrode terminal 4 and the metal pattern 1c is insufficient, leading to the insufficient temperature rise of the main electrode terminal 4 or the metal pattern 1c.

In the semiconductor device 101 of Embodiment 1, in the main electrode terminal 4, the narrow branch portion 4b is pressed against the metal pattern 1c at the position closer to the metal pattern 1c than the wide branch portion 4a is, via the bonding material 2b; therefore, good heat conduction between the main electrode terminal 4 and the metal pattern 1c via the bonding material 2b is obtained, leading to the reduction in the difference in the degree of temperature rise between the main electrode terminal 4 and the metal pattern 1c. As a result, insufficient temperature rise is less likely to occur, and poor bonding between the main electrode terminal 4 and the metal pattern 1c via the bonding material 2b can be suppressed. In the finished semiconductor device 101, obtaining these effects at the time of manufacture thereof can be confirmed from, for example, the bend 4c of the narrow branch portion 4b being closer to the metal pattern 1c than the bend 4c of the wide branch portion 4a is, or, from the bonding material 2b between the narrow branch portion 4b and the metal pattern 1c being thinner than the bonding material 2b between the wide branch portion 4a and the metal pattern 1c. The thickness of the bonding material 2b between the narrow branch portion 4b and the metal pattern 1c at the thickest portion is, for example, less than half the thickness of the bonding material 2b between the wide branch portion 4a and the metal pattern 1c at the thinnest portion.

In Step S2, the narrow branch portion 4b is pressed against the metal pattern 1c via the bonding material 2b, so that the state of the narrow branch portion 4b where the narrow branch portion 4b tilted to be closer to the metal pattern 1c in the tip portion 4d side changes to a state substantially parallel to the metal pattern 1c. Even if the distance between the main electrode terminal 4 and the metal pattern 1c is made larger than expected, due to assembly accuracy, deformation by heating, or the like, at the time of manufacturing, the tip portion 4d of the narrow branch portion 4b is located close to the metal pattern 1c due to the configuration in which the main electrode terminal 4 is provided with the difference of elevation W2 before bonding. In this case, in the finished semiconductor device 101, the tip portion 4d of the narrow branch portion 4b is closer to the metal pattern 1c than the bend 4c of the narrow branch portion 4b is, and the tip portion 4d of the narrow branch portion 4b is closer to the metal pattern 1c than the entire wide branch portion 4a. That is, the bonding material 2b between the narrow branch portion 4b and the metal pattern 1c is thinner in the tip portion 4d side in the narrow branch portion 4d, and the bonding material 2b between the tip portion 4d of the narrow branch portion 4b and the metal pattern 1c is thinner than the bonding material 2b between the wide branch portion 4a and the metal pattern 1c at its thinnest portion. The tip portion 4d of the narrow branch portion 4b being located near the metal pattern 1c promotes heat conduction between the main electrode terminal 4 and the metal pattern 1c via the bonding material 2 in Step S3.

As a result, insufficient temperature rise is less likely to occur, and poor bonding between the main electrode terminal 4 and the metal pattern 1c via the bonding material 2b can be suppressed. Further, this eases the conditions for the assembly accuracy required for bonding the main electrode terminal 4 and the metal pattern 1c.

The bend 4c of the narrow branch portion 4b is more prone to be deformed than the bend 4c of the wide branch portion 4a because of its narrowness in width. Therefore, when the narrow branch portion 4b is pressed against the metal pattern 1c via the bonding material 2b and the degree of bending of the bend 4c of the narrow branch portion 4b increases, the stress applied to each component of the semiconductor device 101 is small, and damage to each component of the semiconductor device 101 is unlikely to occur. That is, even if the difference of elevation W2 is provided between the bend 4c of the narrow branch portion 4b and the tip portion 4d of the narrow branch portion 4b, damage to each component of the semiconductor device 101 is unlikely to occur during manufacturing. Further, the wide branch portion 4a is also bonded to the metal pattern 1c; therefore, the bonding area required for energization can be secured. The narrower the narrow branch portion 4b is, the more the narrow branch portion 4b is deformed easily. The width of the narrow branch portion 4b is, for example, ¼ or less of the width of the wide branch portion 4a. The wider the narrow branch portion 4b is, the better the heat conduction becomes between the narrow branch portion 4b and the metal pattern 1c. The width of the narrow branch portion 4b is, for example, ⅕ or more of the width of the wide branch portion 4a. The width of the narrow branch portion 4b is, for example, ⅕ or more and ¼ or less of the width of the wide branch portion 4a.

That both the difference of elevation W1 and the difference of elevation W2 are provided on the main electrode terminal 4 before bonding with the metal pattern 1c prevents the wide branch portion 4a from obstructing the deformation of the narrow branch portion 4b when the main electrode terminal 4 is pressed against the metal pattern 1c. Therefore, the effect that the conditions for assembly accuracy required for the bonding of the main electrode terminal 4 and the metal pattern 1c to each other are eased is all the more certain, which is obtained by having the configuration in which the difference of elevation W2 is provided on the narrow branch portion 4b before bonding, and the narrow branch portion 4b is deformed at the time of bonding.

The semiconductor device 101 may have a plurality of electrode terminals. As the number of electrode terminals included in the semiconductor device 101 increases, the effect of the variation in temperature rise at the time of bonding the electrode terminals and the metal pattern with each other inflicted on the quality of the semiconductor device 101 becomes greater. Therefore, by using the main electrode terminals 4 having the structure described in Embodiment 1 for each of the plurality of electrode terminals included in the semiconductor device 101, a greater effect of quality improvement can be obtained. However, the main electrode terminal 4 described in Embodiment 1 may be used for just a limited portion of the plurality of electrode terminals included in the semiconductor device 101.

B, Embodiment 2

<B-1. Configuration>

Figure 6:
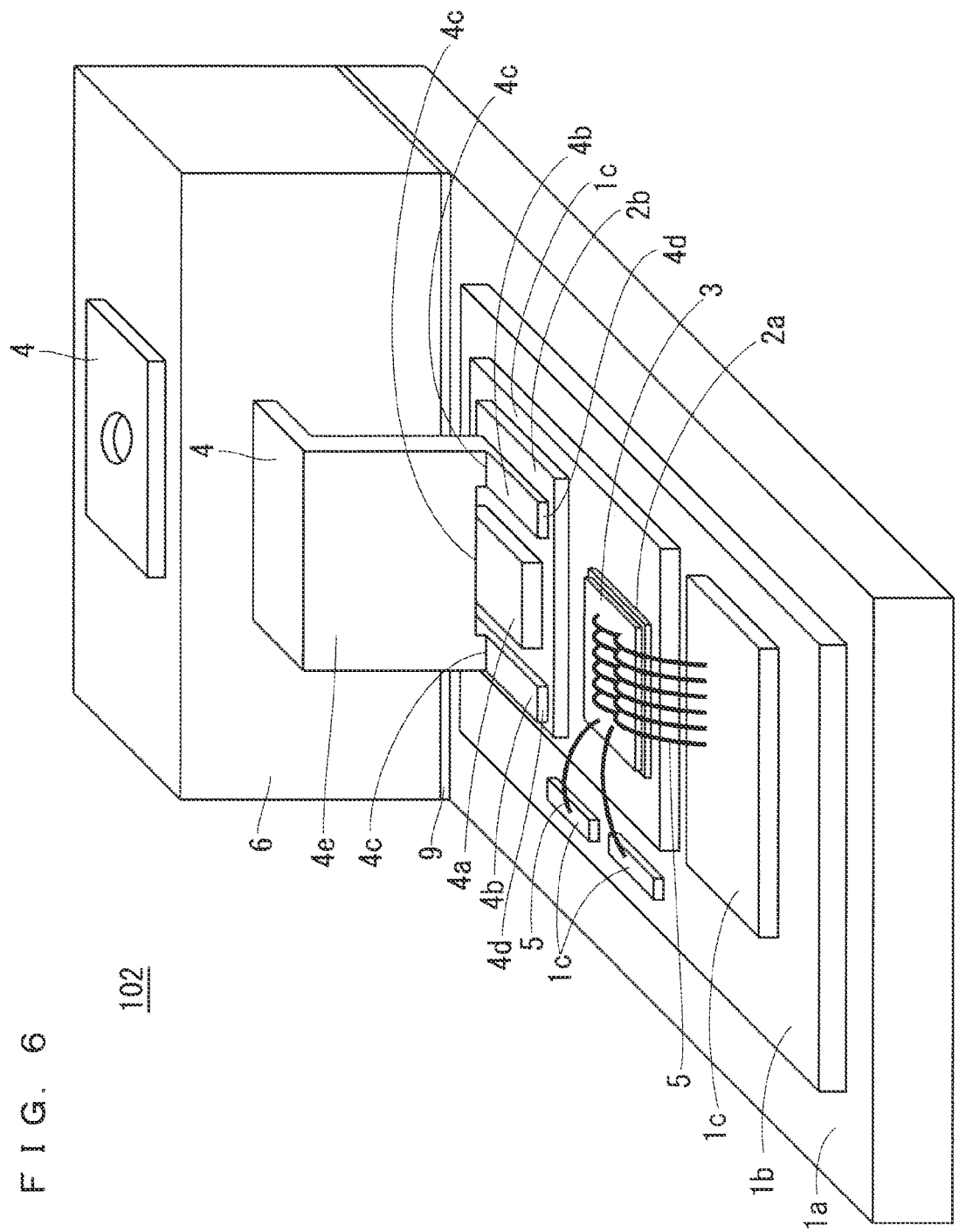
FIG. 6 is a diagram illustrating a bonded state between a main electrode terminal and the metal pattern of the semiconductor device of Embodiment 2.

FIG. 1 is a cross-sectional view illustrating a semiconductor device 102 of Embodiment 2. FIG. 6 is a diagram illustrating a bonded portion between the main electrode terminal 4 and the metal pattern 1c of the semiconductor 102. The main electrode terminal 4 included in the semiconductor device 102 is different from the main electrode terminal 4 included in the semiconductor device 101 in that the bonding portion to the metal pattern 1c, being a portion on one end side of the main electrode terminal 4 in the extending direction is branched in a different manner. The semiconductor device 102 is otherwise similar to the semiconductor device 101 of Embodiment 1.

As illustrated in FIG. 6, in the semiconductor device 102, the bonding portion to the metal pattern 1c, being a portion on one end side of the main electrode terminal 4 in the extending direction, is branched into three branch portions including one wide branch portion 4a, and two narrow branch portions 4b arranged on both sides thereof in the width direction. The wide branch portion 4a and the two narrow branch portions 4b each have a bend 4c. The width of each of the two narrow branch portions 4b is, for example, ¼ or less of the width of the wide branch portion 4a. The width of each of the two narrow branch portions 4b is, for example, ⅕ or more of the width of the wide branch portion 4a. The width of each of the two narrow branch portions 4b is, for example, ⅕ or more and ¼ or less of the width of the wide branch portion 4a.

Before bonding to the metal pattern 1c, each of the two narrow branch portions 4b is provided with a difference of elevation similar to the difference of elevation W2 described in Embodiment 1. That is, in each of the two narrow branch portions 4b, the tip portion 4d is located at the lower side than the bend 4c. The difference of elevation is, for example, in the range of 50 μm or more and 150 μm or less and, for example, about 100 μm. The difference of elevation may or may not be the same for the two narrow branches 4b.

Also, in order for each bend 4c of the two narrow branch portions 4b to be located at the lower side than the bend 4c of the wide branch portion 4a, a difference of elevation similar to the difference of elevation W1 described in Embodiment 1 is provided between each of the bend 4c of the two narrow branch portions 4b and the bend 4c of the wide branch portion 4a. The difference of elevation is, for example, in the range of 50 μm or more and 150 μm or less and, for example, about 100 μm. The difference of elevation may or may not be the same for the two narrow branches 4b.

<B-2. Manufacturing Method>

The manufacturing method of the semiconductor device 102 of Embodiment 2 is the same as the manufacturing method of the semiconductor device 101 described in Embodiment 1, other than the point that the shape of the main electrode terminal 4 used therein is different.

In Embodiment 2, in each of the two narrow branch portions 4b, the tip portion 4d is located at the lower side than the bend 4c. Accordingly, in Step S2, when the case 6 with the main electrode terminal 4 integrated is brought close to the base portion 1 to attach the case 6 to the base portion 1, first, the tip portions 4d of the two narrow branch portions 4b contact the metal pattern 1c.

When a load is further applied to the case 6 from this state and the case 6 is pushed down to the specified position, the tip portion 4d side from the bends 4c of the two narrow branch portions 4b (that is, the portions bonded to the metal pattern 1c) are pressed against the metal pattern 1c, so that the degree of bending of the bends 4c of the two narrow branch portions 4b increases. That is, each of the two narrow branch portions 4b is deformed so that the tip portion 4d moves upward relative to the bend 4c, and the bonding portions of the two narrow branch portions 4b with the metal pattern 1c is substantially parallel to the surface of the metal pattern 1c. Further, the two narrow branch portions 4b are pressed against the metal pattern 1c via the bonding material 2b in a state where the bonding portions with the metal pattern 1c are substantially parallel to the surface of the metal pattern 1c.

When the distance between the main electrode terminal 4 and the metal pattern 1c at the time of bonding becomes larger than expected due to assembly accuracy or deformation by heating at the time of manufacturing or the like, in the bonding material 2b between each of the two narrow branches 4b and the metal pattern 1c, the bonding material 2b is thinner in the tip portion 4d side of the narrow branch portion 4b.

In the finished semiconductor device 102, in the bonding material 2b, the portions between the two narrow branch portions 4b and the metal pattern 1c are thinner than the bonding material 2b between the wide branch portion 4a and the metal pattern 1c. For example, in the bonding material 2b, the portions between the two narrow branch portions 4b and the metal pattern 1c are thinner in their entire region, respectively, than the thinnest portion of the bonding material 2b between the wide branch portion 4a and the metal pattern 1c.

Further, in the finished semiconductor device 102, the bends 4c of the two narrow branch portions 4b are located closer to the metal pattern 1c than the bend 4c of the wide branch portion 4a is, respectively.

In the semiconductor device 102, with the respective two narrow branch portions 4b, an effect similar to the effect obtained by the narrow branch portion 4b described in Embodiment 1 is obtained. In Embodiment 2, the narrow branch portions 4b are further arranged on both sides of the wide branch portion 4a in the width direction; therefore, the variation in the width direction of the main electrode terminal 4 is reduced in the degree of temperature rise of the main electrode terminal 4 or the metal pattern 1c in Step S3. As a result, insufficient temperature rise is less likely to occur, and the quality of bonding between the metal pattern 1c and the main electrode terminal 4 by the bonding material 2b becomes better.

C. Embodiment 3

Figure 8:
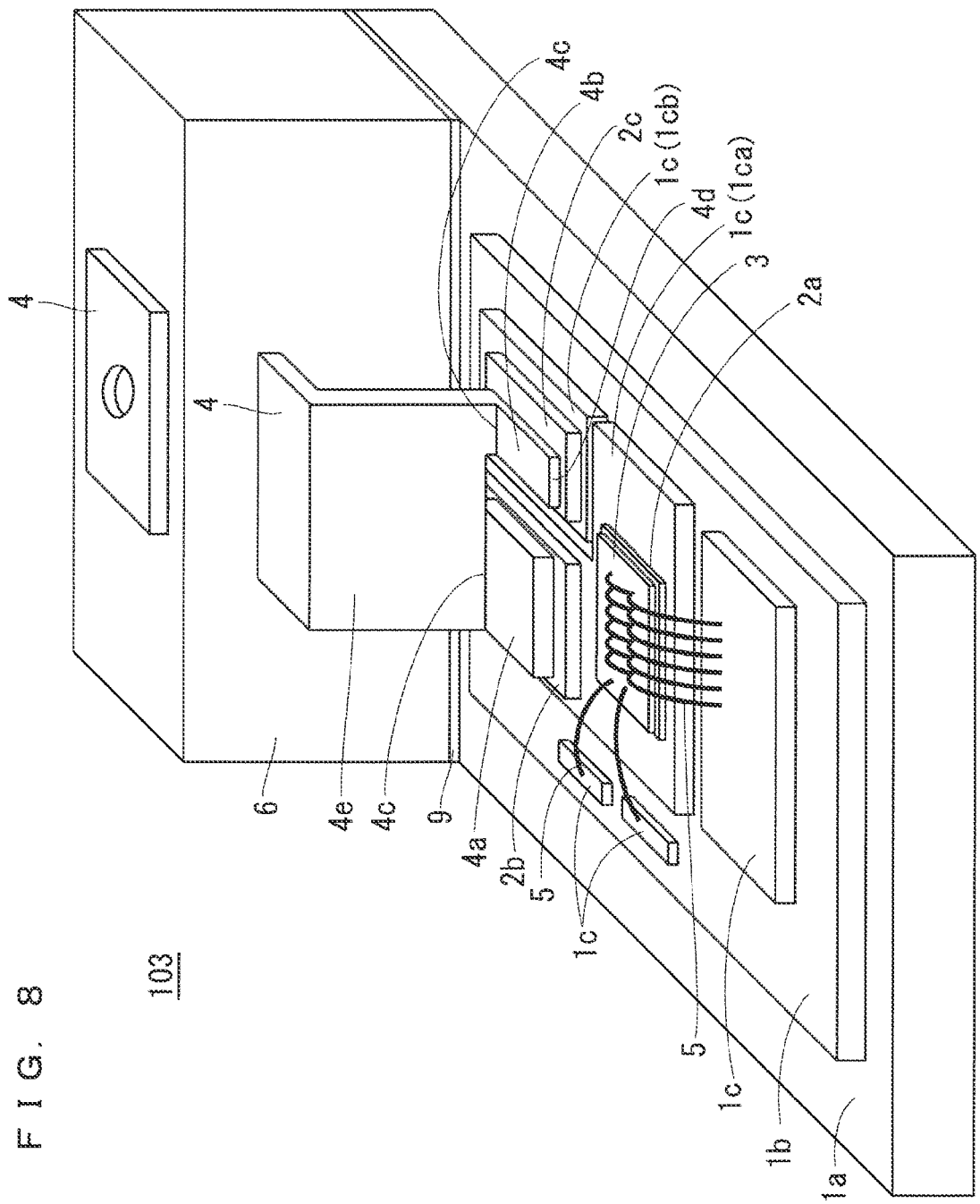
FIG. 8 is a diagram illustrating a bonded state between the main electrode terminal and the metal pattern of the semiconductor device of Embodiment 3.

FIG. 1 is a cross-sectional view illustrating a semiconductor device 103 of Embodiment 3. FIG. 8 is a diagram illustrating a bonded portion between the main electrode terminal 4 and the metal pattern 1c of the semiconductor 103. In comparison, the semiconductor device 103 is different from the semiconductor device 101 of Embodiment 1 in that a portion 1cb of the metal pattern 1c to which the narrow branch portion 4b is bonded is not connected to a portion lea of the metal pattern 1c to which the wide branch portion 4a is bonded. Further, in the semiconductor device 103, the wide branch portion 4a and the portion 1ca of the metal pattern 1c are bonded by the bonding material 2b, and the narrow branch portion 4b and the portion 1cb of the metal pattern 1c are bonded by the bonding material 2c. The semiconductor device 103 is otherwise similar to the semiconductor device 101. Further, the manufacturing method of the semiconductor device 103 is the same as the manufacturing method of the semiconductor device 101 described in Embodiment 1, other than the point that the portion lea and the portion 1cb of the metal pattern 1c are not connected, and the narrow branch portion 4b and the portion 1cb of the metal pattern 1c are bonded by the bonding material 2c. The material of the bonding material 2c is, for example, the same as the material of the bonding material 2b.

Figure 7:
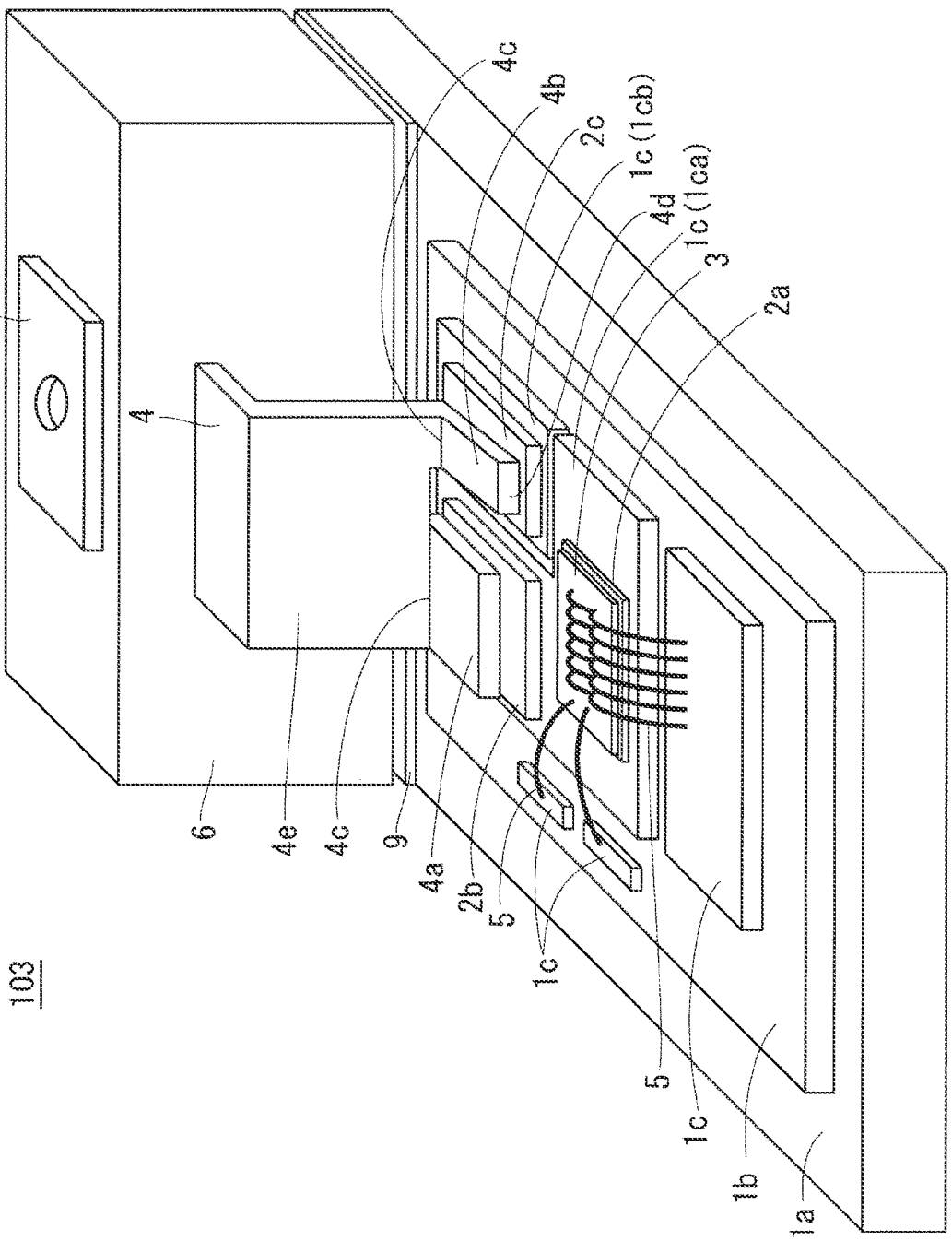
FIG. 7 is a diagram illustrating a state in a process of bonding the main electrode terminal and the metal pattern of the semiconductor device of Embodiment 3.

FIG. 7 is a diagram illustrating a state in the middle of pressing the case 6 to which the main electrode terminal 4 is fixed against the base portion 1 in Step S2. In the state illustrated in FIG. 7, the tip 4d side of the narrow branch portion 4b is in contact with the portion 1cb of the metal pattern 1c, and the bend 4c side of the narrow branch portion 4b is not in contact with the portion 1cb of the metal pattern 1c. Further, the wide branch portion 4a is not in contact with the portion 1ca of the metal pattern 1c.

The semiconductor device 103 has two effects. One of the effects is an effect relating to the bonding of the main electrode terminal 4 and the metal pattern 1c, which is the same effect as described in Embodiment 1. Another effect is related to heat radiation during operation of the semiconductor element 3. Hereinafter, the effect related to heat radiation during operation of the semiconductor element 3 will be described.

During the operation of the semiconductor element 3, the semiconductor element 3 generates heat due to the loss in the energized state. Further, during the operation of the semiconductor element 3, the current controlled by the semiconductor element 3 flows through the main electrode terminal 4, and Joule heat is generated at the main electrode terminal 4 due to the resistance of the main electrode terminal 4. The heat generated by the semiconductor element 3 and the main electrode terminal 4 is mainly transferred to the heat sink 1a via the metal pattern 1c and the insulating substrate 1b. As the current controlled by the semiconductor element 3 increases, the Joule heat generated at the main electrode terminal 4 also increases, and the degree of temperature rise of the main electrode terminal 4 also increases.

When the temperature of the main electrode terminal 4 rises, the heat transferred from the main electrode terminal 4 having high temperature to the metal pattern 1c increases and the temperature of the metal pattern 1c rises. As a result, the temperature of the semiconductor element 3 mounted on the metal pattern 1c rises.

In the semiconductor device 103, the portion 1cb of the metal pattern 1c to which the narrow branch portion 4b is bonded and the portion 1ca of the metal pattern 1c to which the wide branch portion 4a and the semiconductor element 3 are bonded are not connected; therefore, no current flows through the narrow branch portion 4b during the operation of the semiconductor element 3, and Joule heat is not generated in the narrow branch portion 4b.

Part of the Joule heat generated at the main electrode terminal 4 during the operation of the semiconductor element 3 is transferred to the heat sink 1a via the portion 1cb of the metal pattern 1c to which the narrow branch portion 4b is bonded and the insulating substrate 1b. The part of the Joule heat generated in the main electrode terminal 4 is transferred to the heat sink 1a without passing through the portion 1ca of the metal pattern 1c on which the semiconductor element 3 is mounted, so that the temperature rise of the semiconductor element 3 can be suppressed. Therefore, a larger current is controllable with the semiconductor device 103.

Modification may also be adoptable in which, in a form of combining Embodiment 2 and Embodiment 3, the two narrow branch portions 4b are bonded to the portions not connected the portion of the metal pattern 1c on which the semiconductor element 3 is mounted, respectively, in the configuration of the semiconductor device 102 of Embodiment 2.

The Embodiments can be combined, appropriately modified or omitted.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a metal pattern;
a semiconductor element bonded on the metal pattern; and
an electrode terminal extending with a width, wherein
the electrode terminal is branched into a plurality of branch portions in a width direction on one end side of an extending direction thereof,
of the plurality of branch portions, a first branch portion and a second branch portion are bonded on the metal pattern via a bonding material, respectively,
the first branch portion has a wider width in the width direction than that of the second branch portion, and
the bonding material between the second branch portion and the metal pattern is thinner than the bonding material between the first branch portion and the metal pattern.

2. The semiconductor device according to claim 1, wherein,
a width of the second branch portion is ¼ or less of a width of the first branch portion.

3. The semiconductor device according to claim 1, wherein
the width of the second branch portion is ⅕ or more of the width of the first branch portion.

4. The semiconductor device according to claim 1, wherein
in the bonding material between the second branch portion and the metal pattern, a thickness therein is thinner in the tip portion side of the second branch portion.

5. The semiconductor device according to claim 1, wherein
in the metal pattern, a portion to which the first branch portion is bonded and a portion to which the second branch portion is bonded are not connected to each other.

6. The semiconductor device according to claim 1, wherein,
the electrode terminal is branched into the first branch portion, the second branch portion, and a third branch portion, as a plurality of branch portions in a width direction on one end side of an extending direction thereof,
the first branch portion has a wider width than that of the third branch portion,
the second branch portion is located in one side in the width direction of the first branch portion, and the third branch portion is located in the other side in the width direction of the first branch portion, and
the bonding material between the third branch portion and the metal pattern is thinner than the bonding material between the first branch portion and the metal pattern.

7. The semiconductor device according to claim 6, wherein,
a width of the second branch portion is ¼ or less of a width of the first branch portion, and
a width of the third branch portion is ¼ or less of the width of the first branch portion.

8. The semiconductor device according to claim 6, wherein
a width of the second branch portion is ⅕ or more of a width of the first branch portion, and the width of the third branch portion is ⅕ or more of the width of the first branch portion.

9. The semiconductor device according to claim 6, wherein
in the bonding material between the second branch portion and the metal pattern, a thickness therein is thinner in the tip portion side of the second branch portion, and
in the bonding material between the third branch portion and the metal pattern, a thickness therein is thinner in a tip portion side of the third branch portion.

10. The semiconductor device according to claim 6, wherein
in the metal pattern, a portion to which the first branch portion is bonded and a portion to which the second branch portion is bonded are not connected to each other, and
in the metal pattern, the portion to which the first branch portion is bonded and a portion to which the third branch portion is bonded are not connected to each other.

11. A semiconductor device comprising:
a metal pattern;
a semiconductor element bonded on the metal pattern; and
an electrode terminal extending with a width, wherein
the electrode terminal is branched into a plurality of branch portions in a width direction on one end side of an extending direction thereof,
of the plurality of branch portions, each of first branch portion and a second branch portion has a bend,
each of the first branch portion and the second branch portion is bonded on the metal pattern in a tip portion side from the bend via a bonding material,
the first branch portion has a wider width in the width direction than that of the second branch portion, and
the bend of the second branch portion is closer to the metal pattern than the bend of the first branch portion is.

12. The semiconductor device according to claim 11, wherein
a width of the second branch portion is ¼ or less of the width of the first branch portion.

13. The semiconductor device according to claim 11, wherein
the width of the second branch portion is ⅕ or more of the width of the first branch portion.

14. The semiconductor device according to claim 11, wherein
in the bonding material between the second branch portion and the metal pattern, a thickness therein is thinner in a tip portion side of the second branch portion.

15. The semiconductor device according to claim 11, wherein
in the metal pattern, a portion to which the first branch portion is bonded and a portion to which the second branch portion is bonded are not connected to each other.

16. The semiconductor device according to claim 11, wherein
the electrode terminal is branched into the first branch portion, the second branch portion, and a third branch portion, as a plurality of branch portions in a width direction on one end side of an extending direction thereof,
the first branch portion has a wider width than that of the third branch portion,
the second branch portion is located in one side in the width direction of the first branch portion, and the third branch portion is located in the other side in the width direction of the first branch portion,
the third branch portion has a bend,
the third branch portion is bonded on the metal pattern in a tip portion side from the bend via the bonding material, and
the bend of the third branch portion is closer to the metal pattern than the bend of the first branch portion is.

17. The semiconductor device according to claim 16, wherein
a width of the second branch portion is ¼ or less of a width of the first branch portion,
a width of the third branch portion is ¼ or less of the width of the first branch portion.

18. The semiconductor device according to claim 16, wherein
a width of the second branch portion is ⅕ or more of a width of the first branch portion, and,
the width of the third branch portion is ⅕ or more of the width of the first branch portion.

19. The semiconductor device according to claim 16, wherein
in the bonding material between the second branch portion and the metal pattern, a thickness therein is thinner in the tip portion side of the second branch portion, and
in the bonding material between the third branch portion and the metal pattern, a thickness therein is thinner in a tip portion side of the third branch portion.

20. The semiconductor device according to claim 16, wherein
in the metal pattern, a portion to which the first branch portion is bonded and a portion to which the second branch portion is bonded are not connected to each other, and
in the metal pattern, the portion to which the first branch portion is bonded and a portion to which the third branch portion is bonded are not connected to each other.

21. A method of manufacturing the semiconductor device according to claim 1,
wherein each of the first branch portion and the second branch portion has a bend,
the method comprising bonding between the electrode terminal and the metal pattern being performed by heating and melting the bonding material, and then curing the bonding material,
wherein before the bonding between the electrode terminal and the metal pattern is performed, a degree of bending of the bend of the first branch portion is made larger than a degree of bending of the bend of the second bending portion, and
wherein at a point where the bonding between the electrode terminal and the metal pattern is performed, the tip portion side from the bend of the second branch portion is pressed against the metal pattern, thereby, making the degree of bending of the bend of the second branch portion large.

22. A method of manufacturing the semiconductor device according to claim 11,
comprising bonding between the electrode terminal and the metal pattern being performed by heating and melting the bonding material, and then curing the bonding material,
wherein before the bonding between the electrode terminal and the metal pattern is performed, a degree of bending of the bend of the first branch portion is made larger than a degree of bending of the bend of the second branch portion, and wherein at a point where the bonding between the electrode terminal and the metal pattern is performed, the tip portion side from the bend of the second branch portion is pressed against the metal pattern, thereby, making the degree of bending of the bend of the second branch portion large.

* * * * *